(12) United States Patent
Moon et al.

(10) Patent No.: US 12,181,271 B2
(45) Date of Patent: Dec. 31, 2024

(54) ESTIMATING IN-DIE OVERLAY WITH TOOL INDUCED SHIFT CORRECTION

(71) Applicant: KLA CORPORATION, Milpitas, CA (US)

(72) Inventors: Min-Yeong Moon, Ann Arbor, MI (US); Stilian Pandev, Santa Clara, CA (US); Dimitry Sanko, Vallejo, CA (US)

(73) Assignee: KLA CORPORATION, Milpitas, CA (US)

( * ) Notice: Subject to any disclaimer, the term of this patent is extended or adjusted under 35 U.S.C. 154(b) by 374 days.

(21) Appl. No.: 17/674,809

(22) Filed: Feb. 17, 2022

(65) Prior Publication Data

US 2023/0258446 A1 Aug. 17, 2023

(51) Int. Cl.
| | | |
|---|---|---|
| G01B 11/24 | (2006.01) | |
| G03F 7/00 | (2006.01) | |
| G06N 3/0464 | (2023.01) | |
| G06N 3/09 | (2023.01) | |
| G06N 5/022 | (2023.01) | |
| G06N 20/00 | (2019.01) | |
| H01L 21/66 | (2006.01) | |

(52) U.S. Cl.
CPC ........ *G01B 11/24* (2013.01); *G03F 7/706841* (2023.05); *G06N 3/09* (2023.01); *G06N 5/022* (2013.01); *G06N 20/00* (2019.01); *H01L 22/12* (2013.01); *G03F 7/70633* (2013.01); *G06N 3/0464* (2023.01)

(58) Field of Classification Search
CPC ............... G01B 11/24; G03F 7/706841; G03F 7/70633; G06N 3/02; G06N 3/04; G06N 3/042; G06N 3/044; G06N 3/0464; G06N 3/09; G06N 5/022; G06N 20/00; G06N 20/10; G06N 20/20; H01L 22/12
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,429,943 B1 | 8/2002 | Opsal et al. |
| 7,478,019 B2 | 1/2009 | Zangooie et al. |
| 7,933,026 B2 | 4/2011 | Opsal et al. |
| 9,291,554 B2 | 3/2016 | Kuznetsov et al. |
| 9,739,702 B2 | 8/2017 | Bringoltz et al. |
| 9,915,522 B1 | 3/2018 | Jiang et al. |

(Continued)

OTHER PUBLICATIONS

Katz et al., Machine Learning for Tool Induced Shift (TIS) Reduction, Mar. 2020, pp. 1-7, available at ResearchGate.

(Continued)

*Primary Examiner* — Shane D Woolwine
(74) *Attorney, Agent, or Firm* — Hodgson Russ LLP

(57) ABSTRACT

A metrology module includes an estimation model that is configured to provide an estimation of independent overlay with tool induced shift on received wafers based on only one azimuth angle spectra. The estimation model can use at least one machine learning algorithm. The estimation model can be derived by the machine learning algorithm applied to calculated training data based on a first training sample set from initial metrology measurements and an additional tool induced shift training sample.

22 Claims, 6 Drawing Sheets

(56) References Cited

U.S. PATENT DOCUMENTS

| | | |
|---|---|---|
| 10,769,320 B2 | 9/2020 | Kuznetsov et al. |
| 11,604,063 B2 | 3/2023 | Pandev et al. |
| 2013/0286395 A1 | 10/2013 | Lee et al. |
| 2015/0046121 A1* | 2/2015 | Dziura ................ G01N 21/956 702/179 |
| 2016/0117812 A1 | 4/2016 | Pandev et al. |
| 2018/0129139 A1 | 5/2018 | Jiang et al. |
| 2019/0178630 A1 | 6/2019 | Amit et al. |
| 2020/0285976 A1 | 9/2020 | Srikantha et al. |
| 2021/0142466 A1 | 5/2021 | Ophir et al. |

OTHER PUBLICATIONS

Ophir et al., Machine Learning for Tool Induced Shift (TIS) Reduction: An HVM Case Study, Feb. 2021, abstract, Proc. of SPIE, vol. 11611.

Katz et al., Machine Learning for Tool Induced Shift (TIS) Reduction, Mar. 2020, abstract, Proc. of SPIE, vol. 11325.

WIPO, International Search Report for International Application No. PCT/US2023/013089, Aug. 25, 2023.

\* cited by examiner

|  | 2AZ Solution with TIS Correction | 1AZ Solution Trained on TIS Error |
|---|---|---|
| Blind Wafer 1 |  |  |
| Blind Wafer 2 |  |  |
| Blind Wafer 3 |  |  |

ESTIMATING IN-DIE OVERLAY WITH TOOL INDUCED SHIFT CORRECTION

FIELD OF THE DISCLOSURE

This disclosure relates to semiconductor metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Metrology processes are used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Tool induced shift (TIS) is a measurement error attributed to tool asymmetry issues. TIS is commonly used to measure the accuracy of metrology tools in the semiconductor industry. Overlay (OVL) measurement inaccuracy is commonly caused by lens aberration, lens alignment, illumination alignment, or asymmetries on the measured target. TIS impacts total measurement uncertainty (TMU) and tool-to-tool matching, and TIS variation across wafer can account for inaccuracy, if not fully corrected, because it depends on the incoming process condition. In addition, both lot-to-lot and wafer-to-wafer process variation are influenced by TIS in terms of overlay performance, which also includes metrology tool-to-tool efficiency in terms of throughput.

Typical metrology measurements of targets on a wafer site estimate the overlay between target structures in images of the targets, usually for two images per target (0° and 180°-rotated images) to achieve good accuracy. Previously, measuring overlay relied on a model or specially designed targets, which used information extracted from measured images including noise level across targets and an overlay accuracy metric to find ground truth for TIS. Specially-designed targets were typically needed.

Improved techniques are needed to improve throughput and provide better performance.

BRIEF SUMMARY OF THE DISCLOSURE

A method is provided in a first embodiment. The method includes determining a first training sample set from initial metrology measurements. The initial metrology measurements include spectra at two azimuthal angles and, optionally, skew. An additional tool induced shift training sample is prepared by adding a negative value of reference on opposite azimuth angle data from the first training sample set. Original azimuth angle data from the first training sample set and the opposite angle data in a second training sample set is stacked. At least one machine learning algorithm is applied to the first training sample set and the second training sample set to derive an estimation model. Independent overlay is obtained with tool induced shift correction embedded at inline wafers collected for spectra at only one azimuthal angle. The estimation model is used to provide estimations of independent overlay with tool induced shift.

The additional tool induced shift training sample can be a reference for external metrology-based approach.

The additional tool induced shift training sample can be a self-calibrated overlay for reference-less approach.

The machine learning algorithm can be one of a linear model, a neural network, or a convolutional network.

The machine learning algorithm can be a model assist approach, a model-less approach, a reference-based approach, or a self-calibrated recipe. For example, a tool induced shift signal can be used to calibrate a system parameter.

The spectra at two azimuthal angles can be collected from a spectroscopic ellipsometer, a soft x-ray reflectometer, a small angle x-ray scatterometer, or an imaging system.

The initial metrology measurements can include a tilt in an X direction and a Y direction perpendicular to the X direction.

The using the estimation model can include determining non-zero overlay and/or edge placement error.

The machine learning algorithm can be further trained using data with critical dimension, height, side wall angle, or film dispersion.

The independent overlay with the tool induced shift can be determined for multiple tools.

The two azimuthal angles can be separated by 180°.

At least one of the determining, the preparing, the stacking, the applying, or the using can be carried out by at least one processor.

A non-transitory computer readable medium can store a program configured to instruct a processor to execute the method of the first embodiment. A metrology module can include the non-transitory computer readable medium.

A system is provided in a second embodiment. The system includes a metrology module that includes a processor. The metrology module comprises an estimation model configured to provide an estimation of independent overlay with tool induced shift on received wafers. The estimation model uses at least one machine learning algorithm. The estimation is based on only one azimuth angle spectra and the estimation model is based on spectra at two azimuthal angles.

In an instance, the estimation model is derived by the machine learning algorithm applied to calculated training data based on a first training sample set from initial metrology measurements and an additional tool induced shift training sample. The initial metrology measurements include the spectra at two azimuthal angles and, optionally, skew. The additional tool induced shift training sample is at opposite azimuth angle data from the first training sample set with a negative value of reference.

In an instance, the processor is further configured to stack original azimuth angle data from the first training sample set and the opposite angle data in a second training sample set and obtain independent overlay with tool induced shift correction embedded at inline wafers collected for spectra at only one azimuthal angle.

In an instance, the machine learning algorithm is further trained using critical dimension, height, side wall angle, or film dispersion.

In an instance, the two azimuthal angles are separated by 180°.

The machine learning algorithm can be one of a linear model, a neural network, or a convolutional network.

The machine learning algorithm can be a model assist approach, a model-less approach, a reference-based approach, or a self-calibrated recipe.

The metrology module can be further configured to determine non-zero overlay and/or edge placement error.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein provide a method for measuring independent overlay with TIS correction. This can be performed with a standard metrology target instead of a specially-designed metrology target. These embodiments provide on-device measurement, which can avoid the need to find a ground truth for TIS. TIS-corrected overlay estimation can be performed quickly, which can avoid the need to retrain libraries to correct TIS. One azimuth angle spectra can be used for TIS-corrected overlay estimation. Using one azimuth angle spectra can improve throughput by avoiding a second azimuth spectra measurement.

Figure 4:
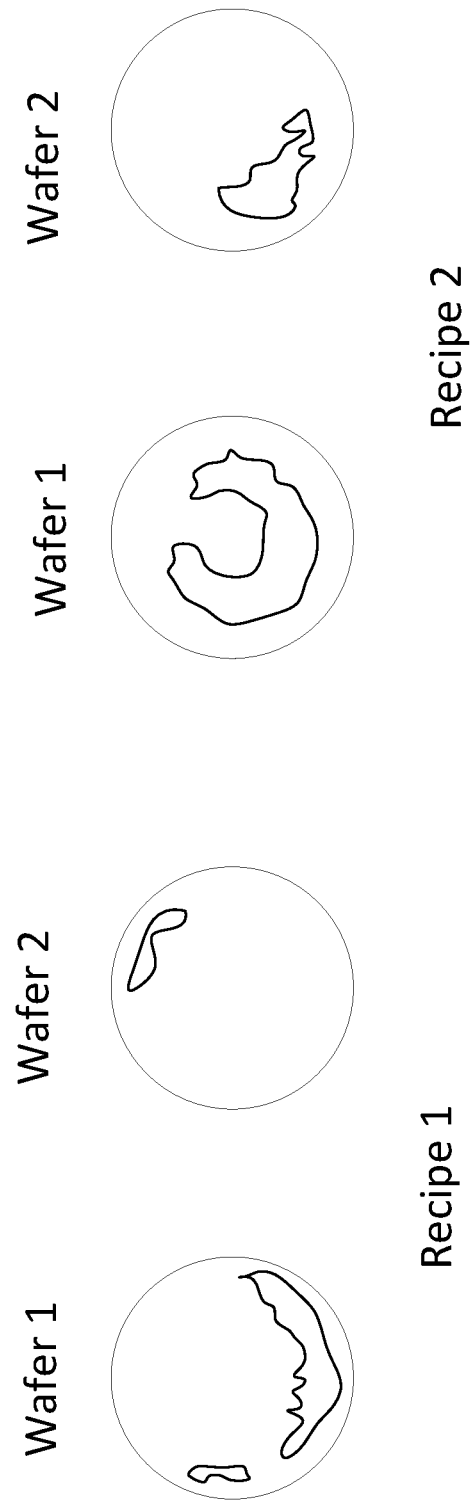
FIG. 4 shows exemplary TIS error maps representing actual data on two different wafers and different recipes.

The amount of TIS error can vary depending on sample location within wafers, across wafers, across lots, across tools, or using different machine learning recipes. FIG. 4 shows an example of a TIS error map on different sample location within a wafer, different wafers, and different recipes. As shown in FIG. 4, it may not be feasible to estimate ground truth TIS on all samples across different wafers from targets, which needs TIS trained model when calculating overlay without TIS error or any other potential error. The methods disclosed herein can accurately measure in-die overlay with TIS error correction after the recipe is trained.

When a TIS error is negligible, independent overlay from a base azimuth angle and opposite angle are opposite signs with a same magnitude of overlay values. When TIS error is introduced to overlay measurements, the relations are defined below. AZ180 and AZ0 represent azimuth measurements opposite each other by 180°.

OVL from AZ180=True OVL(=OVL w TIS correction)+TIS error

OVL from AZ0=−True OVL(=OVL w TIS correction)+TIS error

By rearranging above relations, TIS error and TIS-corrected overlay can be calculated using two azimuth signals.

$$TIS\ error = \frac{OVL\ from\ AZ180 + OVL\ from\ AZ0}{2},$$

$$TIS\ corrected\ OVL = \frac{OVL\ from\ AZ180 - OVL\ from\ AZ0}{2}$$

This TIS correction can be applied to the inference stage of trained machine learning recipe without a TIS corrected model.

To demonstrate the idea, TIS-corrected overlay was applied to two different machine learning recipes that were trained without considering a TIS correction model. The validated wafers were selected as out of training process range to see if TIS-corrected overlay could change the overlay map.

Figure 5:
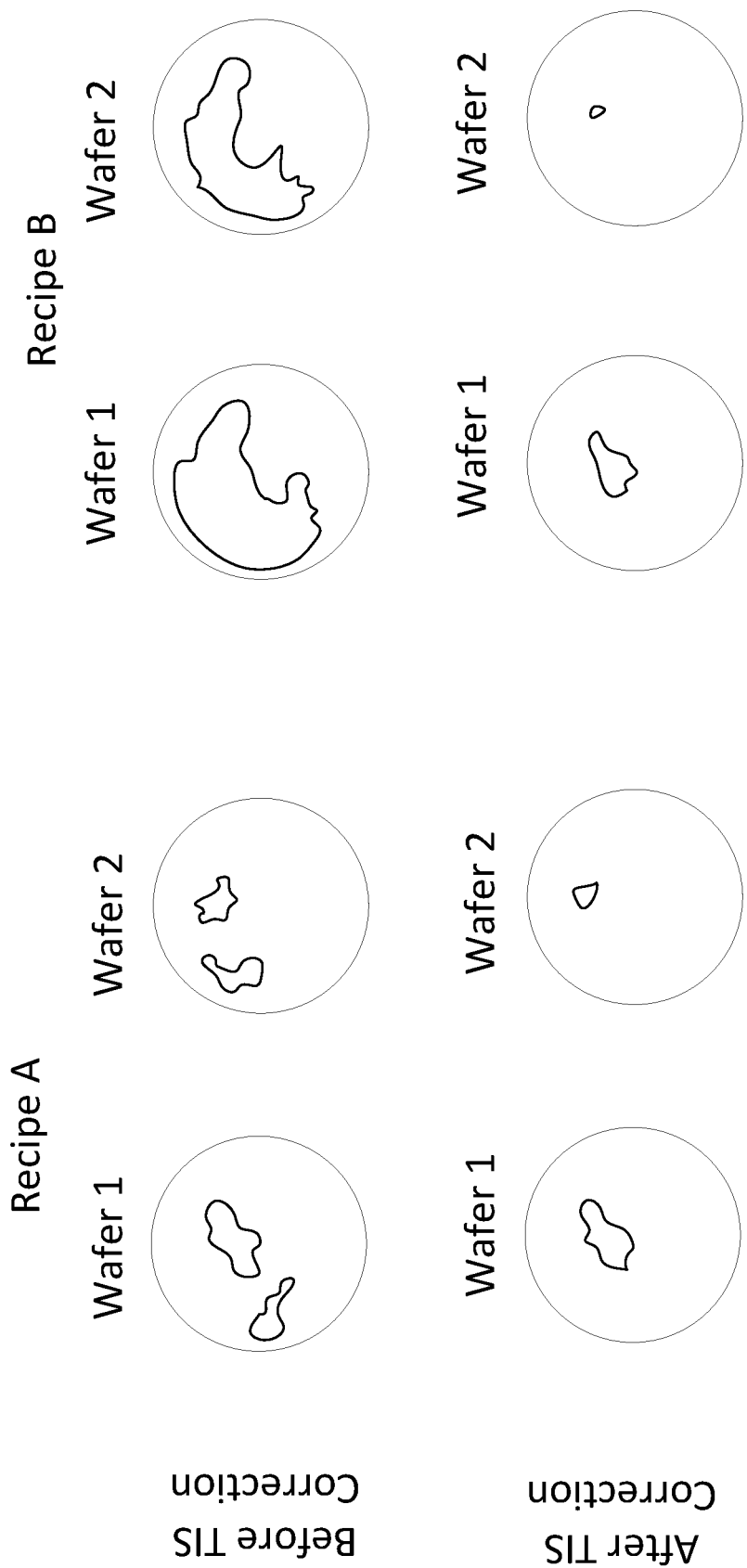
FIG. 5 shows an exemplary overlay map comparison representing actual data between before TIS correction (top) and after TIS correction) bottom on an outside of a training process range using Recipe A and Recipe B for an instance where TIS is significant.
Figure 6:
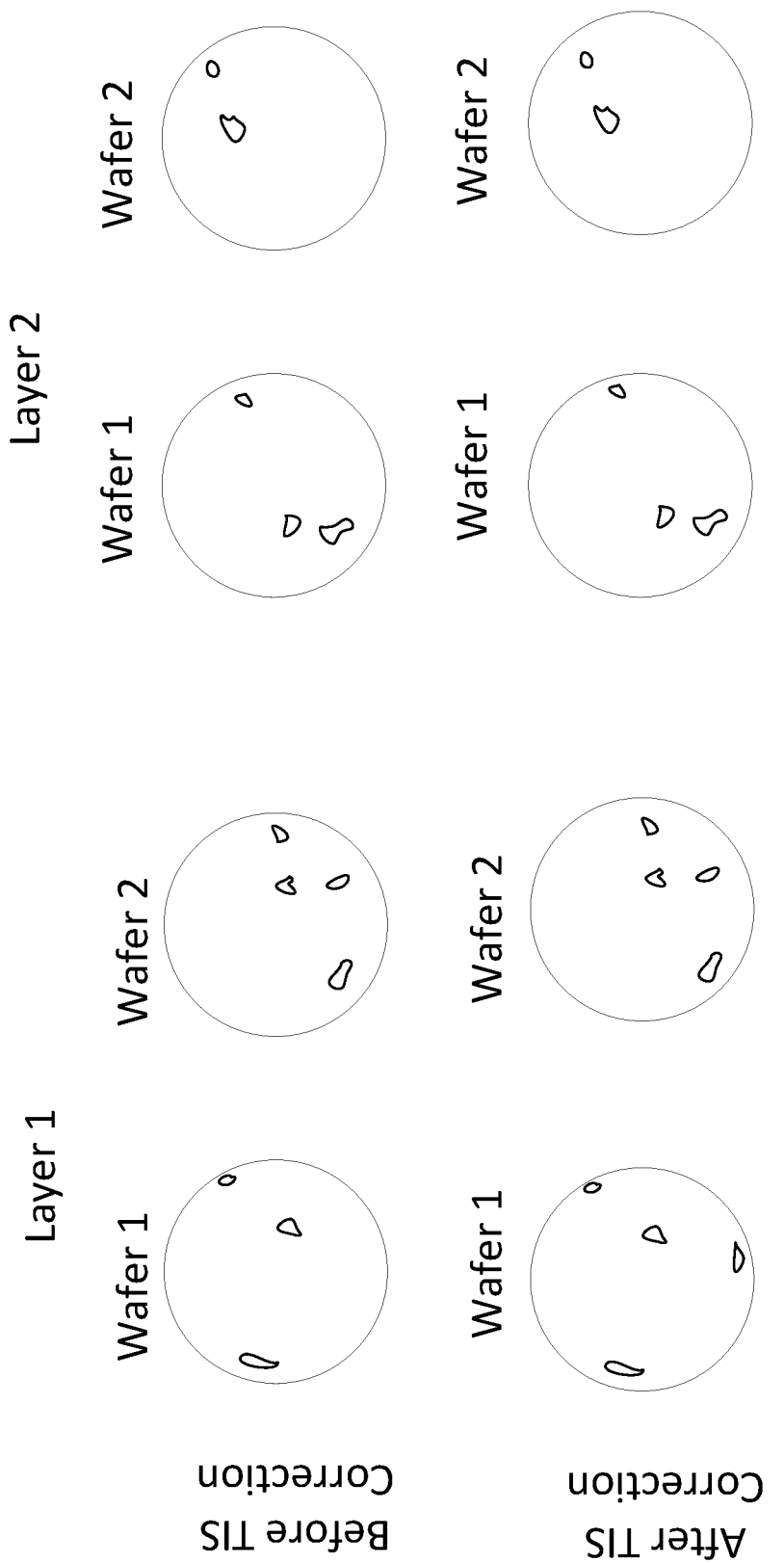
FIG. 6 shows an exemplary overlay map comparison representing actual data between before TIS correction (top) and after TIS correction (bottom) on blind process of record wafers using two different layers (Layer 1 and Layer 2) for an instance where TIS is not significant.

As depicted in FIG. 5, overlay measurements from two different recipes before TIS correction show different signatures on the outside of a training process range, which is expected due to different training of machine learning modules. Overlay measurement after TIS correction from two different recipes provides identical or nearly identical wafer map/statistics, which was verified with another external metrology. With TIS correction, the trained machine learning recipe can increase the robustness outside of training range. Another example shown in FIG. 6 demonstrates that when TIS error is negligible, both overlay maps from before TIS correction/after TIS correction provide identical overlay maps and related statistics.

Figure 2:
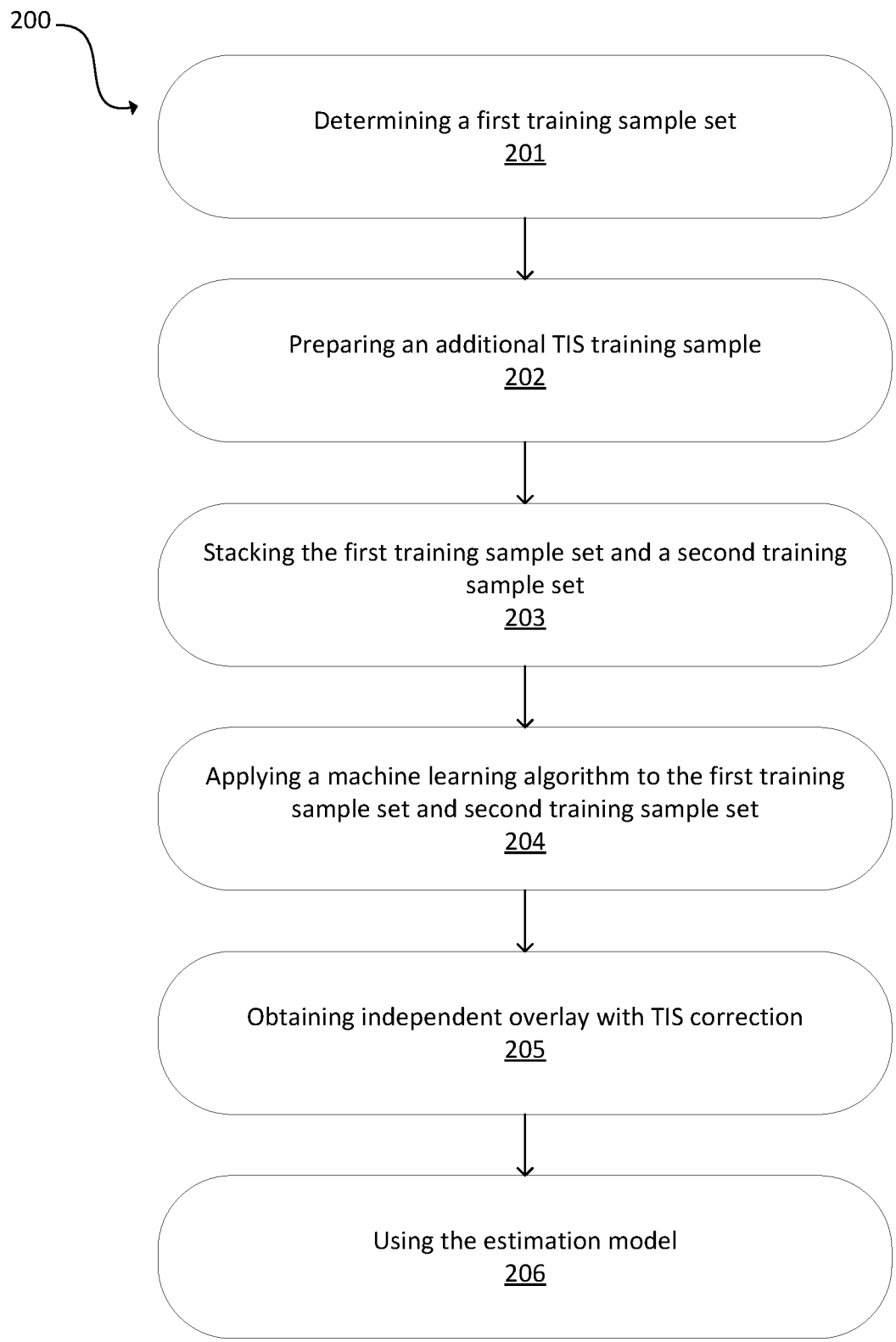
FIG. 2 is a flowchart of a method in accordance with an embodiment of the present disclosure.

Collecting two azimuth spectra on incoming inline wafers may increase throughput by a multiple of two compared to using a machine learning recipe without TIS correction with one azimuth spectra. To improve throughput, a machine learning recipe with TIS correction can be trained to as described in FIG. 2. As shown in FIG. 2, two azimuth spectra can be used in a training set to train a TIS model. First, two azimuth spectra are collected on skew wafer (if any) and all training nominal wafers (e.g., process of record (POR)). Skew design is intended and is not by nature of a process. A training sample with TIS correction is then created with data augmentation. For example, in the direction of OVL Y (X), AZ180 (AZ90) spectra is labeled with original references and AZ0 (AZ270) spectra is labeled with flipped OVL references (i.e., —references). In these examples, the AZ is azimuth and the X and Y are perpendicular directions. By concatenating both original (AZ180)/augmented (AZ0) spectra, the number of training sample is doubled. In this way, both azimuth data as different samples are used to train TIS model during recipe training. Thus, a final recipe is created on a solution for one azimuth spectra.

The method 200 describes this embodiment in more detail. Some or all of the steps of the method 200 can be performed using a processor.

At 201, a first training sample set is determined from initial metrology measurements. The initial metrology measurements include spectra at two azimuthal angles and, optionally, skew. For example, the training spectra can be collected from synthetic design of experiments (DOE) at 1AZ (e.g., AZ180), skew DOE from 2AZ (e.g., AZ180+0), and training nominal (POR) wafers from 2AZ (AZ180+0). Thus, the two azimuthal angles can be separated by 180°.

The initial metrology measurements can include a tilt in an X direction and a Y direction perpendicular to the X direction. By selecting a particular wavelength region that is only strongly sensitive to overlay, then tilt effect can be separated from overlay measurement.

At 202, an additional TIS training sample is prepared by adding a negative value of reference on opposite azimuth angle data from the first training sample set. For example, for skew and/or training process of record wafers, TIS-corrected samples can be generated for the opposite azimuth angle by multiplying—1 to reference from the original azimuth angle (e.g., reference for AZ180, —reference for AZ0). Making an additional TIS training sample (AZ0 with flipped reference) may not affect an underlayer measurement difference.

The additional TIS training sample can be a reference for an external metrology-based approach or a self-calibrated overlay for a reference-less approach. The reference or self-calibrated overlay can be negative values. An external metrology-based approach uses dense reference data per each training nominal wafers/skew wafer and can be trained against a reference-like, image-based approach including a scanning electron microscope (SEM). A reference-less approach does not use reference data to train a recipe. Self-calibrated overlay can be derived purely from the signal.

The original azimuth angle data from the first training sample set and the opposite angle data in a second training sample set can be concatenated or otherwise stacked at 203. This can double the number of training samples because samples from both azimuth angles are stacked.

At 204, at least one machine learning algorithm is applied to the first training sample set and the second training sample set to derive an estimation model. The estimation model can operate on a recipe with one azimuthal angle. The machine learning algorithm can be one of a linear model, a neural network, or a convolutional network, though other architectures are possible. In particular, the machine learning algorithm can be a neural network or linear model.

In an instance, the machine learning algorithm is a model assist approach, a model-less approach, a reference-based approach, or a self-calibrated recipe. A TIS signal can be used to calibrate a system parameter.

Independent overlay with TIS correction embedded at inline or other production wafers collected for spectra can be obtained using only one azimuthal angle at 205.

The estimation model is used at 205 to provide estimations of independent overlay with TIS. For example, independent overlay can be determined using the trained recipe on process of record wafers collected at only one azimuth angle (e.g., AZ180).

Using the estimation model also can include determining non-zero overlay and/or edge placement error.

The spectra at two azimuthal angles can be collected from a spectroscopic ellipsometer, a soft x-ray reflectometer, a small angle x-ray scatterometer, an imaging system, or other systems.

In an instance, the machine learning algorithm is further trained using data with critical dimension, height, side wall angle, or film dispersion. Estimating a parameter besides OVL can be used for process change detection.

The independent overlay with the TIS can be determined for multiple tools. This can avoid the need to develop different machine learning strategies for multiple tools to train TIS error.

Figure 3:
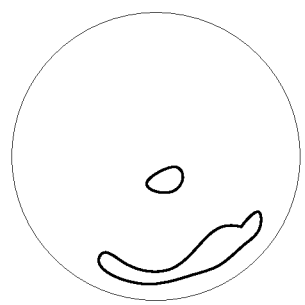
FIG. 3 shows exemplary overlay maps representing actual data comparing the 2AZ technique with TIS correction and a 1AZ machine learning recipe trained using TIS error.
Figure 3:
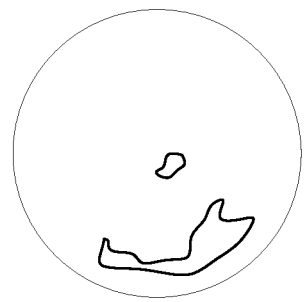
Figure 3:
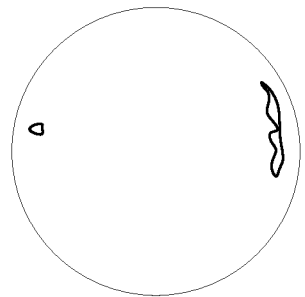
Figure 3:
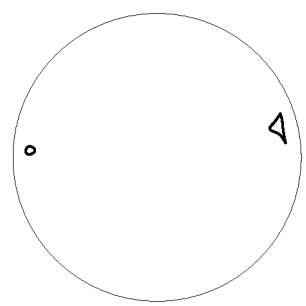
Figure 3:
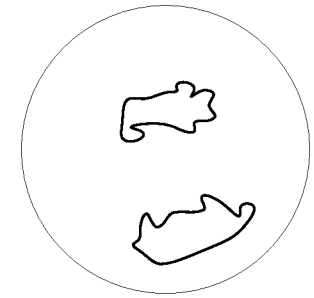
Figure 3:
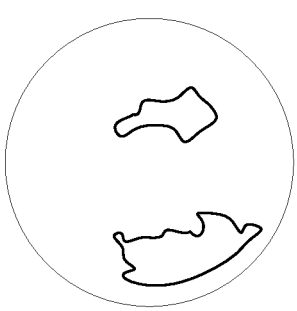

To prove if a one azimuth angle (1AZ) recipe-trained TIS model is enough to correct TIS error, the one azimuth angle recipe solution was compared with the two azimuth angle (2AZ) solution on blind wafers as illustrated in FIG. 3. As shown in FIG. 3, the 1AZ recipe-trained TIS model performs as well as the 2AZ model, but with improved throughput.

The TIS corrected approaches disclosed herein can be used to self-calibrate an overlay machine learning recipe. Instead of putting a negative sign on reference, AZ0 spectra on a skew wafer can be labeled with—self calibrated overlay obtained from an asymmetric signal.

A TIS signal can be obtained using sum of first principal component of selected harmonic or Mueller element components at selected wavelength region for AZ180 and AZ0. In an instance, the TIS signal is close to zero. Both TIS signal and TIS overlay error, TIS error=(OVL from AZ180+ OVL from AZ0)/2, could be used to calibrate different system parameter calibration including area of interest (AOI), azimuth, wafer loading angle, or other parameters by minimizing TIS signal/TIS OVL error.

Embodiments of the present invention provide efficient methods and mechanisms for implementing metrology measurements in semiconductor production processes and can improve semiconductor metrology. Metrology methods, modules, and systems are provided, for using machine learning algorithms to improve the metrology accuracy and the overall process throughput. Methods disclosed herein include calculating training data concerning metrology metric(s) from initial metrology measurements, applying machine learning algorithm(s) to the calculated training data to derive an estimation model of the metrology metric(s), deriving measurement data from images of sites on received wafers, and using the estimation model to provide estimations of the metrology metric(s) with respect to the measurement data. While the training data may use two images per site, in operation a single image per site may suffice. This can reduce the measurement time to less than half the current measurement time.

Figure 1:
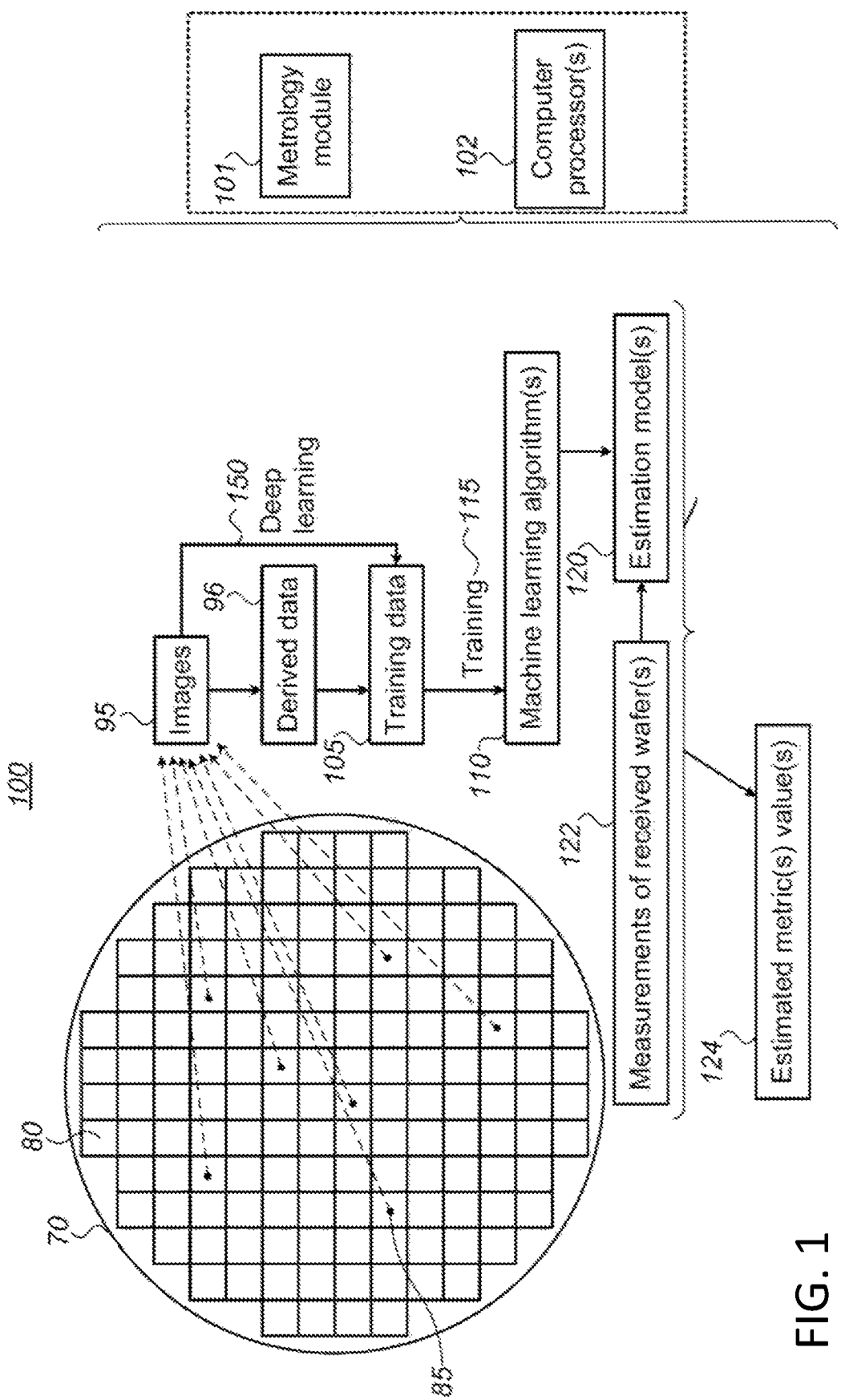
FIG. 1 is a block diagram of a system with a metrology module in accordance with an embodiment of the present disclosure.

FIG. 1 is a block diagram of a system 100 with a metrology module 101 according to an embodiment of the invention. The system 100 may include a metrology module 101 associated with at least one computer processor 102 and/or a metrology module 101 comprising at least one computer processor 102. While illustrated as separate, the computer processor 102 can be part of the metrology module 101.

Metrology module 101 may comprise, or be associated with one or more estimation models 120, which may be implemented on the computer processors 102 as part of metrology module 101 or associated therewith (e.g., as training or simulation module(s) that are used to derive estimation model(s) 120). Estimation model(s) 120 may be configured to provide estimations of at least one metrology metric with respect to measurement data of sites on received wafers. Estimation model(s) 120 are derived by at least one machine learning algorithm 110, which is applied to calculated training data 105 in a training stage 115 that relates the at least one metrology metric to initial metrology measurements. The training stage 115 can include some of the steps in the method 200 of FIG. 2.

Metrology module 101 may be configured to calculate training data 105 concerning the metrology metric(s) from the initial metrology measurements. These metrology measurements can relate to multiple sites 85 in a plurality of fields 80 of one or more training wafer 70. The metrology module 101 also can apply machine learning algorithm(s) 110 to calculated training data 105 to derive estimation model 120 of the metrology metric(s), derive measurement data 122 from images of sites on the received wafers, and use estimation model 120 to provide estimations of the metrology metric(s) 124 with respect to measurement data 122.

For example, the calculation of training data 105 may comprise using pairs of images 95 and 180°-rotated images 95 derived from sites 85 on at least one training wafer 70. Training data 105 can include at least one processed feature 96 (as derived data 96), which is derived from each pair of images 95 with respect to each site 85. For example, the processed feature(s) may comprise one-dimensional (1D) kernels representing an average along a specified direction in respective images 95 and/or image transformation data comprising discrete cosine transform (DCT) or Fourier transform of respective images 95.

In an embodiment, training data 105 may comprise, at least partly, raw images 95 derived from plurality of sites 85 on one or more training wafer(s) 70 as the initial metrology measurements.

The methods disclosed herein can be performed by the system 100 and/or metrology module 101 described above. For example, the method 200 can be implemented using the system 100 and/or metrology module 101. The method 200 may be at least partially implemented by at least one computer processor (e.g., 102), such as in metrology module 101. Certain embodiments include computer program products comprising a computer readable storage medium having computer readable program embodied therewith configured to carry out the relevant steps of method 200.

In an instance, the metrology module 101 includes an estimation model 120 configured to provide an estimation of independent overlay with TIS on received wafers. The estimation model uses at least one machine learning algorithm 110. The estimation is based on only one azimuth angle spectra. The estimation model 120 can be based on spectra at two azimuthal angles relative to a surface of the training wafer 70. While a training wafer 70 is illustrated, a production wafer also can be used.

The estimation model 120 can be derived by the machine learning algorithm 110 applied to calculated training data based on a first training sample set from initial metrology measurements and an additional TIS training sample. The initial metrology measurements include spectra at two azimuthal angles and, optionally, skew. The additional TIS training sample is at opposite azimuth angle data from the first training sample set with a negative value of reference. The two azimuthal angles can be separated by 180°. At least one computer processor 102 can be configured to derive the estimation model 120.

The metrology module 101 can be further configured to stack original azimuth angle data from the first training sample set and the opposite angle data in a second training sample set and obtain independent overlay with TIS correction embedded at inline wafers collected for spectra at only one azimuthal angle.

The machine learning algorithm 110 can be further trained using critical dimension, height, side wall angle, or film dispersion.

The machine learning algorithm 110 can be one of a linear model, a neural network, or a convolutional network. The machine learning algorithm can use a model assist approach, a model-less approach, a reference-based approach, or a self-calibrated recipe.

The metrology module 101 can be further configured to determine non-zero overlay and/or edge placement error.

These computer program instructions may also be stored in a computer readable medium that can direct a computer, other programmable data processing apparatus, or other devices to function in a particular manner, such that the instructions stored in the computer readable medium can perform steps of the method disclosed herein.

The computer program instructions also may be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts disclosed herein.

The system may further include an illumination system which illuminates a target (such as the training wafer 70 or other wafers), a collection system which captures relevant information provided by the illumination system's interaction (or lack thereof) with a target, device or feature, and a processing system (such as metrology module 101) which analyzes the information collected using one or more algorithms. The system 100 can be used to measure structural and material characteristics (e.g., material composition, dimensional characteristics of structures and films such as film thickness and/or critical dimensions of structures, overlay, etc.) associated with various semiconductor fabrication processes. These measurements are used to facilitate process controls and/or yield efficiencies in the manufacture of semiconductor dies.

The system 100 can comprise one or more hardware configurations which may be used in conjunction with certain embodiments of this invention to, for example, measure the various aforementioned semiconductor structural and material characteristics. Examples of such hardware configurations include, but are not limited to, a spectroscopic ellipsometer (SE), an SE with multiple angles of illumination, an SE measuring Mueller matrix elements (e.g. using rotating compensator(s)), a single-wavelength ellipsometer, a beam profile ellipsometer (angle-resolved ellipsometer), a beam profile reflectometer (angle-resolved reflectometer), a broadband reflective spectrometer (spectroscopic reflectometer), a single-wavelength reflectometer, an angle-resolved reflectometer, an imaging system, or a scatterometer (e.g. speckle analyzer).

The hardware configurations can be separated into discrete operational systems. One or more hardware configurations can be combined into a single tool. U.S. Pat. No. 7,933,026, which is hereby incorporated by reference in its entirety, provides an example. There are typically numerous optical elements in such systems, including certain lenses, collimators, mirrors, quarter-wave plates, polarizers, detectors, cameras, apertures, and/or light sources. The wavelengths for optical systems can vary from about 120 nm to 3 microns. For non-ellipsometer systems, signals collected can be polarization-resolved or unpolarized. Multiple metrology tools also can be used for measurements on a single or multiple metrology targets, such as described in U.S. Pat. No. 7,478,019, which is incorporated by reference in its entirety.

The illumination system of the certain hardware configurations can include one or more light sources. The light source may generate light having only one wavelength (i.e., monochromatic light), light having a number of discrete wavelengths (i.e., polychromatic light), light having multiple wavelengths (i.e., broadband light) and/or light the sweeps through wavelengths, either continuously or hopping between wavelengths (e.g., using tunable sources or swept source). Examples of suitable light sources include a white light source, an ultraviolet (UV) laser, an arc lamp or an electrode-less lamp, a laser sustained plasma (LSP) source, a supercontinuum source (such as a broadband laser source), or shorter-wavelength sources such as x-ray sources, extreme UV sources, or some combination thereof. The light source may also be configured to provide light having sufficient brightness, which in some cases may be a brightness greater than about 1 W/(nm cm$^2$ Sr). The system 100 also can include a fast feedback to the light source for stabilizing its power and wavelength. Output of the light source can be delivered via free-space propagation, or in some cases delivered via optical fiber or light guide.

The system 100 can be designed to make many different types of measurements related to semiconductor manufacturing. For example, the system 100 can measure characteristics of one or more targets, such as critical dimensions, overlay, sidewall angles, film thicknesses, process-related parameters (e.g., focus and/or dose). The targets can include certain regions of interest that are periodic in nature, such as for example gratings in a memory die. Targets can include multiple layers (or films) whose thicknesses can be measured by the metrology tool. Targets can include target designs placed (or already existing) on the semiconductor wafer for use, such as with alignment and/or overlay registration operations. Certain targets can be located at various places on the semiconductor wafer. For example, targets can be located within the scribe lines (e.g., between dies) and/or located in the die itself. In certain embodiments, multiple targets are measured (at the same time or at differing times) by the same or multiple metrology tools. The data from such measurements may be combined. Data from the system 100 can be used in the semiconductor manufacturing process for example to feed-forward, feed-backward and/or feed-sideways corrections to the process (e.g., lithography or etch).

As semiconductor device pattern dimensions continue to shrink, smaller metrology targets are often required. Furthermore, the measurement accuracy and matching to actual device characteristics can increase the need for device-like targets as well as in-die and even on-device measurements. For example, focused beam ellipsometry based on primarily reflective optics can be used. Apodizers can be used to mitigate the effects of optical diffraction causing the spread of the illumination spot beyond the size defined by geometric optics. High-numerical-aperture tools with simultaneous multiple angle-of-incidence illumination can be used to achieve small-target capability.

Other measurement examples can include measuring the composition of one or more layers of the semiconductor stack, measuring certain defects on (or within) the wafer, or measuring the amount of photolithographic radiation exposed to the wafer. In some cases, the system 100 and algorithm may be configured for measuring non-periodic targets.

Measurement of parameters of interest usually involves multiple algorithms. For example, optical interaction of the incident beam with the sample is modeled using an electromagnetic (EM) solver and uses such algorithms as rigorous coupled wave analysis (RCWA), finite element modeling (FEM), method of moments, surface integral method, volume integral method, finite-difference time domain (FDTD), and others. The target of interest is usually modeled (parametrized) using a geometric engine a process modeling engine, or a combination of both. A geometric engine is implemented, for example, in the AcuShape software product from KLA Corporation.

Collected data can be analyzed by a number of data fitting and optimization techniques an technologies including libraries, fast-reduced-order models, regression, machine-learning algorithms, principal component analysis (PCA), independent component analysis (ICA), local-linear embedding (LLE), sparse representation such as Fourier or wavelet transform, a Kalman filter, algorithms to promote matching from same or different tool types, or others. Collected data can also be analyzed by algorithms that do not include modeling, optimization and/or fitting.

Computational algorithms are usually optimized for metrology applications with one or more approaches being used such as design and implementation of computational hardware, parallelization, distribution of computation, load-balancing, multi-service support, or dynamic load optimization. Different implementations of algorithms can be done in firmware, software, FPGA, programmable optics components, etc.

The data analysis and fitting steps can have one or more objectives. Critical dimension, sidewall angle, shape, stress, composition, films, bandgap, electrical properties, focus/dose, overlay, generating process parameters (e.g., resist state, partial pressure, temperature, focusing model), and/or any combination thereof can be measured or otherwise determined. Metrology systems can be modeled or designed. Metrology targets also can be modelled, designed, and/or optimized.

Embodiments disclosed herein also can be used with mask metrology.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A method comprising:
   determining a first training sample set from initial metrology measurements, wherein the initial metrology measurements include spectra at two azimuthal angles and, optionally, skew;
   preparing an additional tool induced shift training sample by adding a negative value of reference on opposite azimuth angle data from the first training sample set;
   stacking original azimuth angle data from the first training sample set and the opposite angle data in a second training sample set;
   applying at least one machine learning algorithm to the first training sample set and the second training sample set to derive an estimation model;
   obtaining independent overlay with tool induced shift correction embedded at inline wafers collected for spectra at only one azimuthal angle; and
   using the estimation model to provide estimations of independent overlay with tool induced shift.

2. The method of claim 1, wherein the additional tool induced shift training sample is a reference for external metrology-based approach.

3. The method of claim 1, wherein the additional tool induced shift training sample is a self-calibrated overlay for reference-less approach.

4. The method of claim 1, wherein the machine learning algorithm is one of a linear model, a neural network, or a convolutional network.

5. The method of claim 1, wherein the machine learning algorithm is a model assist approach, a model-less approach, a reference-based approach, or a self-calibrated recipe.

6. The method of claim 5, wherein a tool induced shift signal is used to calibrate a system parameter.

7. The method of claim 1, wherein the spectra at two azimuthal angles are collected from a spectroscopic ellipsometer, a soft x-ray reflectometer, a small angle x-ray scatterometer, or an imaging system.

8. The method of claim 1, wherein the initial metrology measurements include a tilt in an X direction and a Y direction perpendicular to the X direction.

9. The method of claim 1, wherein using the estimation model includes determining non-zero overlay and/or edge placement error.

10. The method of claim 1, wherein the machine learning algorithm is further trained using data with critical dimension, height, side wall angle, or film dispersion.

11. The method of claim 1, wherein the independent overlay with the tool induced shift is determined for multiple tools.

12. The method of claim 1, wherein the two azimuthal angles are separated by 180°.

13. The method of claim 1, wherein at least one of the determining, the preparing, the stacking, the applying, or the using is carried out by at least one processor.

14. A non-transitory computer readable medium storing a program configured to instruct a processor to execute the method of claim 1.

15. A metrology module comprising the non-transitory computer readable medium of claim 14.

16. A system comprising:
    a metrology module that includes a processor, wherein the metrology module comprises an estimation model configured to provide an estimation of independent overlay with tool induced shift on received wafers, wherein the estimation model uses at least one machine learning algorithm, and wherein the estimation is based on only one azimuth angle spectra and the estimation model is based on spectra at two azimuthal angles;
    wherein the estimation model is derived by the machine learning algorithm applied to calculated training data based on a first training sample set from initial metrology measurements and an additional tool induced shift training sample, wherein the initial metrology measurements include the spectra at two azimuthal angles and, optionally, skew, and wherein the additional tool induced shift training sample is at opposite azimuth angle data from the first training sample set with a negative value of reference.

17. The system of claim 16, wherein the processor is further configured to:
    stack original azimuth angle data from the first training sample set and the opposite angle data in a second training sample set; and
    obtain independent overlay with tool induced shift correction embedded at inline wafers collected for spectra at only one azimuthal angle.

18. The system of claim 16, wherein the machine learning algorithm is further trained using critical dimension, height, side wall angle, or film dispersion.

19. The system of claim 16, wherein the two azimuthal angles are separated by 180°.

20. The system of claim 16, wherein the machine learning algorithm is one of a linear model, a neural network, or a convolutional network.

21. The system of claim 16, wherein the machine learning algorithm is a model assist approach, a model-less approach, a reference-based approach, or a self-calibrated recipe.

22. The system of claim 16, wherein the metrology module is further configured to determine non-zero overlay and/or edge placement error.

* * * * *